(12) United States Patent
Miyajima et al.

(10) Patent No.: US 7,129,175 B2
(45) Date of Patent: Oct. 31, 2006

(54) METHOD OF MANUFACTURING SEMICONDUCTOR DEVICE

(75) Inventors: Hideshi Miyajima, Yokohama (JP); Kazuyuki Higashi, Yokohama (JP); Keiji Fujita, Yokohama (JP); Toshiaki Hasegawa, Kanagawa (JP); Kiyotaka Tabuchi, Kanagawa (JP)

(73) Assignees: Kabushiki Kaisha Toshiba, Tokyo (JP); Sony, Corp., Tokyo (JP)

( * ) Notice: Subject to any disclaimer, the term of this patent is extended or adjusted under 35 U.S.C. 154(b) by 327 days.

(21) Appl. No.: 10/726,678

(22) Filed: Dec. 4, 2003

(65) Prior Publication Data

US 2004/0166680 A1 Aug. 26, 2004

(30) Foreign Application Priority Data

Dec. 6, 2002 (JP) .............................. 2002-355728

(51) Int. Cl.
*H01L 21/302* (2006.01)
*H01L 21/31* (2006.01)
*H01L 21/311* (2006.01)

(52) U.S. Cl. ...................... 438/694; 438/700; 438/758; 438/771

(58) Field of Classification Search ................ 438/700, 438/706, 758, 771, 694
See application file for complete search history.

(56) References Cited

U.S. PATENT DOCUMENTS 5,747,119 A * 5/1998 Hirata ........................ 427/585

6,306,746 B1 * 10/2001 Haley et al. ................. 438/601
2002/0137323 A1 * 9/2002 Loboda ........................ 438/600

OTHER PUBLICATIONS

Higashi, K. et al., "A Manufacturable Copper/Low-k SiOC/SiCN Process Technology for 90nm-node High Performance eDRAM", Proceeding of the IEEE2002 International Interconnect Technology Conference, pp. 15-17, (Jun. 2002).
Fayolle, M. et al., "Intergration of Cu/SiOC in Dual Damascene interconnect for 0.1 μm technology using a new SiC material as dielectric barrier", Proceeding of the IEEE2002 International Interconnect Technology Conference, pp. 39-41, (Jun. 2002).
Kim, T.S. et al., "Integration of Organosilicate Glasses (OSGs) In High Performance Copper Interconnects", Advanced Metallization Conference 2001, pp. 25-31, (Oct. 2001).
Fayolle, M. et al., "Overcomming resist poisoning issue during Si-O-C dielectric integration in Cu Dual Damascene interconnect for 0.1 μm technology", pp. 509-513, (Oct. 2001).
Lin, J.C. et al., "Via First Dual Damascence Integration of nanoporous Ultra Low-k Material", IEEE2002 International Interconnect Technology Conference, pp. 48-50, (Jun. 2002).

* cited by examiner

*Primary Examiner*—Nadine Norton
*Assistant Examiner*—Lynette T. Umez-Eronini
(74) *Attorney, Agent, or Firm*—Finnegan, Henderson, Farabow, Garrett & Dunner, L.L.P.

(57) ABSTRACT

A semiconductor device manufacturing method comprises forming a first insulating film including silicon, carbon, nitrogen, and hydrogen above a substrate in a first chamber, carrying the substrate into a second chamber other than the first chamber, and discharging a rare gas in the second chamber, and forming a second insulating film including silicon, carbon, oxygen, and hydrogen above the first insulating film after the discharging the rare gas.

20 Claims, 2 Drawing Sheets

METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2002-355728, filed Dec. 6, 2002, the entire contents of which are incorporated herein by reference.

BACKGROUND OF THE INVENTION

1. Field of the Invention

The present invention relates to a semiconductor device manufacturing method, including a process of forming a laminated insulating film which comprises an insulating film including silicon, carbon, nitrogen, and hydrogen, and an insulating film including silicon, carbon, oxygen, and hydrogen.

2. Description of the Related Art

Accompanying high-integration and increase in speed of semiconductor devices, reductions of an inter-wiring capacitance and an interlayer capacitance are required. Therefore, developments of techniques for making a low resistance metal wiring and techniques for making a low dielectric insulating film have progressed.

As the techniques for making the low dielectric interlayer insulating, there is an example of an introduction of an SiOC:H film which has a relative dielectric constant lower than that of an $SiO_2$ film which has been conventionally used and which is one of the so-called low dielectric constant interlayer insulating films (Low-k films).

When a Cu wiring is formed at the inside of the SiOC:H film by a dual damascene wiring process, a stopper film is formed in advance on a Cu wiring (lower layer Cu wiring) which is at the lower layer of the Cu wiring.

The reason for this is that the lower layer Cu wiring is not damaged by etching in a process of etching for opening a via hole in the SiOC:H film. Another reason is for suppressing the diffusion of Cu into the interlayer insulating film.

As a stopper film, an SiN film has been conventionally broadly used. However, the relative dielectric constant (relative permittivity) of the SiN film is about 7 and high. Therefore, in recent years, developments of insulating films such as an SiC film, an SiCO film, an SiCN film, and the like have been made to progress. Thereamong, attention has focused on the SiCN film because the SiCN film has an etching rate which is sufficiently lower than that of the SiOC film, and is superior with respect to the etching selectivity, and moreover, is superior also with respect to the relative dielectric constant and the leakage characteristic.

However, in a case of a dual damascene process in which a via hole is formed in advance, in the process of forming a via hole in the SiOC:H film, a concentration of a material (NxHy; x and y are positive integers) having an alkalinity such as $NH_2$ including nitrogen and hydrogen, or the like, becomes high.

This type of NxHy can be the reason for inhibiting the resolution of a resist which will be a resist pattern for forming a wiring trench which is formed after forming the via hole, in particular, a chemically amplified resist. This is because the acid generated at the exposed portion of the resist is neutralized, and the dissolution thereof is inhibited.

Therefore, a predetermined-shaped resist pattern for forming a wiring trench cannot be formed, and the problem that it is difficult to form a predetermined-shaped wiring arises (for example, Document 1 (Overcoming of resist poisoning issue during Si—O—C dielectric integration in Cu Dual Damascene interconnect for 0.1 µm technology, M. Fayolle, G. Fanget, J. Torres, and G. Passemard, Proceedings of Advanced Metallization Conference (AMC) 2001, US Session, Montreal (Canada), Oct. 9–11, 2001, p.209), Document 2 (Integration of Cu/SiOC in Dual Damascene interconnect for 0.1 µm technology using a new SiC material as dielectric barrier, M. Fayolle, J. Torres, G. Passemard, F. Fusalba, G. Ganget, D. Louis, L. Arnaud, V. Girault, J. Cluzel, H. Feldis, M. Rivoire, O. Louveau, T. Mourier, and L. Broussous, Proceedings of the 2002 International Interconnect Technology Conference, San Francisco (Calif., USA), Jun. 3–5, 2002, p.39), and Document 3 (Via First Dual Damascene integration of Nanoporous Ultra Low-k Material, J. C. Lin, H. S. Lee, S. Satyanarayana, H. Martinz, T. Jacobs, K. Brennan, A. Gonzalez, R. Augur, S. L. Shue, C. H. Yu, and M. S. Liang, Proceedings of the 2002 International Interconnect Technology Conference, San Francisco (Calif., USA), Jun. 3–5, 2002, p.48)).

Provided that a dual damascene process in which a wiring trench is formed in advance is used, there is no need to concern the problem about the deterioration in the resolution of the resist. However, in the dual damascene process in which a wiring trench is formed in advance, another problem which does not exist in the dual damascene process in which a via hole is formed in advance exists, and it is not the case that all of the problems are solved by using a dual damascene process in which a wiring trench is formed in advance.

BRIEF SUMMARY OF THE INVENTION

A semiconductor device manufacturing method according to an aspect of the present invention comprises forming a first insulating film including silicon, carbon, nitrogen, and hydrogen above a substrate in a first chamber; carrying the substrate into a second chamber other than the first chamber, and discharging a rare gas in the second chamber; and forming a second insulating film including silicon, carbon, oxygen, and hydrogen above the first insulating film after the discharging the rare gas.

A semiconductor device manufacturing method according to another aspect of the present invention comprises forming a first insulating film including silicon, carbon, nitrogen, and hydrogen above a substrate; irradiating an energy ray on the first insulating film; and forming a second insulating film including silicon, carbon, oxygen, and hydrogen by a plasma CVD method above the first insulating film after the irradiating the energy ray.

A semiconductor device manufacturing method according to another aspect of the present invention comprises forming a first insulating film including silicon, carbon, nitrogen, and hydrogen above a substrate; exposing the substrate in a humidified atmosphere including $H_2O$; heating the substrate after the exposing the substrate; and forming a second insulating film including silicon, carbon, oxygen, and hydrogen by a plasma CVD method above the first insulating film after the heating the substrate.

DETAILED DESCRIPTION OF THE INVENTION

Hereinafter, embodiments of the present invention will be described with reference to the drawings.

(First Embodiment)

FIGS. 1A to 1J are cross-sectional views showing a method of manufacturing a semiconductor device according to a first embodiment of the present invention.

Figure 1A:
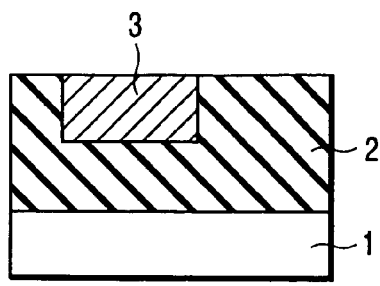
FIGS. 1A to 1J are cross-sectional views showing a method of manufacturing a semiconductor device according to a first embodiment of the present invention.

FIG. 1A shows a substrate having a silicon substrate 1 and a first Cu wiring layer. A plurality of elements (not shown) are integrated in the silicon substrate 1. The first Cu wiring layer comprises an interlayer insulating film 2 provided on the silicon substrate 1, a Cu wiring 3 (buried wiring) formed in the interlayer insulating film 2 by a damascene process, and a barrier metal film (not shown) provided at the bottom surface and the side surface of the Cu wiring 3.

Figure 1E:
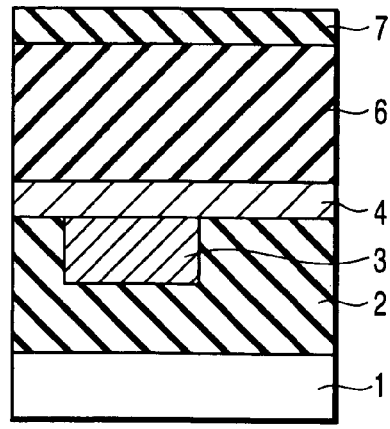
Figure 1B:
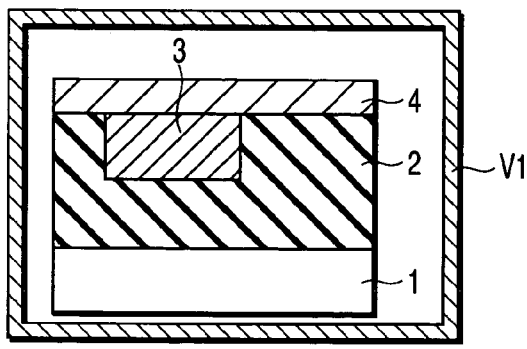

Next, as shown in FIG. 1B, the substrate is carried into a first reactive chamber (first chamber) V1 of a plasma CVD system, and thereafter, an SiCN:H film (first insulating film) 4 whose thickness is 50 nm is formed on the first Cu wiring layer by a plasma CVD process. As a source gas, a mixed gas including, for example, organic silane such as alkylsilane or the like, and NH$_3$, is used. The plasma CVD system is a capacitive coupled type system which comprises an electrode (a counter electrode) provided in the first reactive chamber V1 and to be applied high-frequency power.

The main components of the SiCN:H film 4 are silicon, carbon, and nitrogen, and the SiCN:H film 4 includes hydrogen in an amount of about 45% thereof. The SiCN:H film 4 is used as an etching stopper film. In accordance therewith, at the time of the damascene process which will be described later, etching of the Cu wiring 3 is prevented.

In a conventional method, next, the routine proceeds to the process of forming an interlayer insulating film. However, in the present embodiment, a pretreatment shown hereinafter is carried out in advance.

First, before the substrate is carried into a second reactive chamber (second chamber) of a CVD system, for forming an interlayer insulating film, the second reactive chamber being a different chamber from the reactive chamber V1 of the plasma CVD system used for forming the film SiCN:H film 4, the inside of the second reactive chamber is coated with a film called a precoat film.

In the present embodiment, an SiC:H film (a film comprising Si and C as main components, and including H) is used as the precoat film. The SiC:H film is formed by a CVD process. As a source gas, for example, a gas including organic silane such as alkylsilane or the like, is used. A precoat film which fails to include hydrogen can be used.

The plasma CVD system is a capacitive coupled type system which comprises an electrode (a counter electrode) provided in the second reactive chamber V2 and to be applied high-frequency power. There is no need for the entire interior of the second reactive chamber to be coated with a precoat film. However, the coating film having a sufficient film thickness is formed on the counter electrode.

A susceptor having a resistance heating heater is provided so as to face to the counter electrode in the second reactive chamber. When the precoat film is formed, the susceptor is heated by the resistance heating heater such that the temperature of the susceptor in the second reactive chamber is made to be 450° C. or less. This heating processing at 450° C. or less is carried out for a time longer than that of a He plasma processing(treatment) which will be described hereinafter.

Figure 1F:
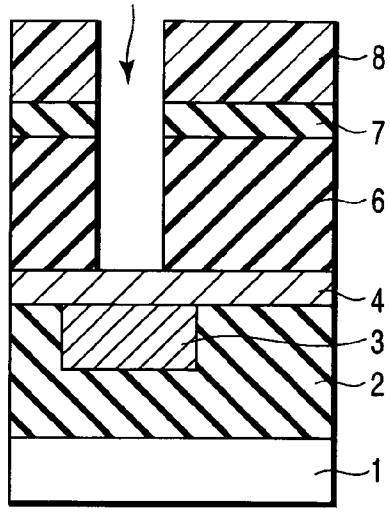
Figure 1C:
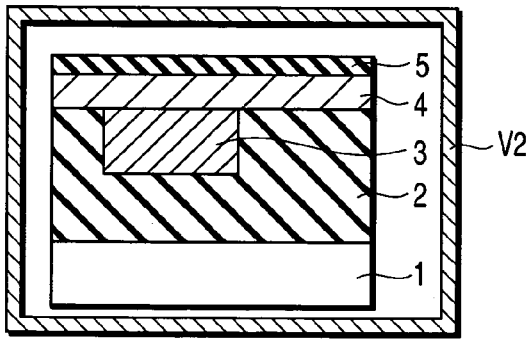

Next, as shown in FIG. 1C, the substrate is carried into the second reactive chamber V2. Thereafter, He gas is introduced into the second reactive chamber V2, and discharging of the He gas is carried out, thereby a plasma is generated in the second reactive chamber V2.

Due to a plasma processing by using the plasma, the SiC:H film which is the precoat film in the second reactive chamber V2, in particular, the SiC:H film on the counter electrode to which high-frequency power has been applied is sputtered by He ions. As a result, as shown in FIG. 1C, a SiC:H film 5 is deposited on the SiCN:H film 4. The film thickness of the deposited SiC:H film 5 is about 2 nm.

Figure 1D:
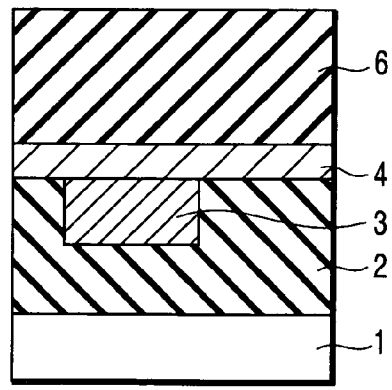

Next, as shown in FIG. 1D, an SiCO:H film (a second insulating film) 6 having 350 nm thickness is formed by a plasma CVD process. At this time, the SiC: H film 5 is oxidized to become a SiCO:H film, and disappears.

As a source gas for the SiCO:H film 6, for example, a mixed gas including organic silane such as alkylsilane or the like, and O$_2$. The film-forming of the SiCO:H film 6 may be carried out continuously following the film-forming of the SiC:H film 5 in the second reactive chamber V2 without the substrate being pulled out of the second reactive chamber V2 of the plasma CVD system used for forming of the SiC:H film 5.

The SiCO:H film 6 is the so-called low dielectric constant interlayer insulating film (Low-k film), and the relative dielectric constant thereof is about 2.9. The relative dielectric constant of an SiO$_2$ film which has been conventionally used as an interlayer insulating film is about 3.9.

Next, as shown in FIG. 1E, an SiO$_2$ film (a third insulating film) 7 whose thickness is 100 nm is formed on the SiCO:H film 6 by a plasma CVD process. As a source gas, for example, a mixed gas including organic silane such as alkylsilane or the like, and O$_2$, is used.

With respect to the SiCO:H film 6 and the other low-k films, because the mechanical strength and the plasma resistance of the films themselves are generally low, there is the concern that damage will arise in the low-k films in the manufacturing process therefor. In order to prevent this type of damage from arising, the SiO$_2$ film (cap film) 7 is formed on the SiCO:H film 6. Provided that it can be used as a cap film, a film formed from a material other than SiO$_2$ may be used.

Next, as shown in FIG. 1F, a resist pattern 8 having an opening portion corresponding to a via hole is formed on the SiO$_2$ film 7, and thereafter, the SiO$_2$ film 7 and the SiCO:H film 6 are etched by an RIE (Reactive Ion Etching) process by using the resist pattern 8 as a mask, thereby a via hole h is opened.

At this time, the SiCN:H film 4 functions as an etching stopper, and therefore, etching of the Cu wiring 3 is prevented. The resist pattern 8 is formed due to a chemically amplified resist being exposed and developed by a well-known photolithography process.

Figure 1G:
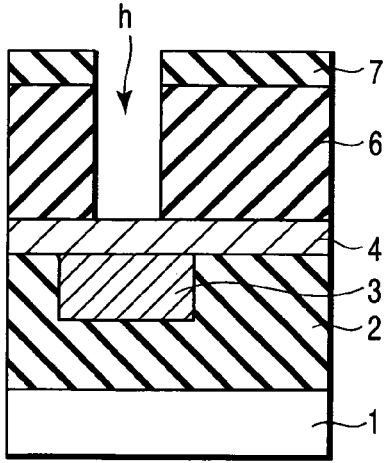

Next, as shown in FIG. 1G, the resist pattern 8 is peeled off by using the discharged O$_2$ gas.

Figure 1H:
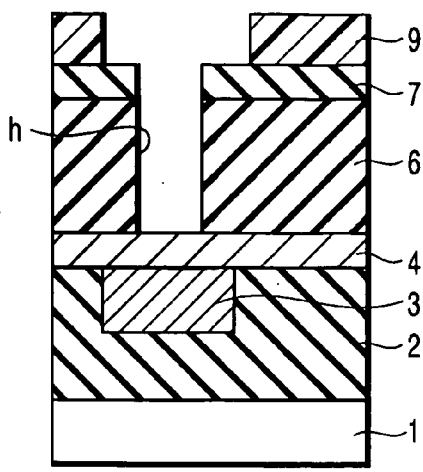

Then, as shown in FIG. 1H, a resist pattern 9 having an opening portion corresponding to a wiring trench is formed on the SiO$_2$ film 7. The process of forming the resist pattern 9 comprises coating a chemically amplified resist on the entire surface so that the interior of the via hole h is buried, thereafter, exposing the chemically amplified resist by a well-known photolithography, and thereafter developing the chemically amplified resist by a well-known photolithography. At this time, the problem that the resolution of the chemically amplified resist deteriorates did not arise. The reason that deterioration in the resolution of the chemically amplified resist did not arise will be described in detail later.

Next, as shown in 1I, the SiO$_2$ film 7 and the SiCO:H film 6 are etched by an RIE process by using the resist pattern 9 as a mask, and a wiring trench t is formed. At this time as well, etching of the Cu wiring 3 is prevented by the SiCN:H film 4. Thereafter, the resist pattern 9 is peeled off by using the discharged O$_2$ gas.

Figure 1J:
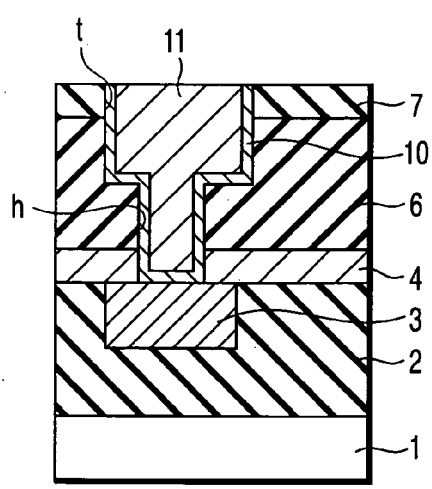

Next, as shown in FIG. 1J, the SiCN:H film 4 under the via hole h is selectively removed by a wet etching process, and thereafter, a barrier metal film 10 and a Cu wiring 11 are buried into the via hole h (including a hole generated due to the SiCN:H film 4 being removed, as well) and the wiring trench t, so that a second Cu wiring layer is obtained.

To describe the process of forming the barrier metal film 10 and the Cu wiring 11 concretely, first, the barrier metal film 10 is formed on the entire surface by a sputtering process such that the inner walls of the via hole h and the wiring trench t are covered, and subsequently, a thin Cu layer (not shown) serving as a seed layer for Cu plating is formed on the barrier metal film 10. Next, the Cu film is formed on the entire surface by a plating process such that the interiors of the via hole h and the wiring trench t are buried, and thereafter, the barrier metal film and the Cu film, which are at the exterior of the via hole h and the wiring trench t, are removed by a chemical mechanical polishing (CMP: Chemical Mechanical Polishing) process, and the surface is flattened.

Before describing the reason that deterioration in the resolution of the chemically amplified resist to be processed into the resist pattern 9 for forming a wiring trench is prevented in accordance with the method of the present embodiment, the reason that deterioration in the resolution of the chemically amplified resist arises in accordance with the conventional method (a method in which the process of FIG. 1C is omitted from the method of the embodiment) which was found by the present inventor and the others will be described.

In the conventional method, immediately after the SiCN:H film 4 is formed, the SiCO:H film 6 which is a Low-k film is formed by a plasma CVD process. However, at this time, the surface of the SiCN:H film 4 which is a underlying layer of the SiCO:H film 6 is oxidized by O$_2$ plasma, and it can be thought that the following reaction arises.

$$\equiv Si-CH_3 + 2O_2 \rightarrow \equiv Si-OH + CO_2 + H_2O$$

Here, ≡Si—CH$_3$ is a group included in the SiCO:H film 4.

The ≡Si—OH formed by the above-described reaction functions as the so-called moisture absorption site absorbing moisture (H$_2$O). Therefore, a layer in which moisture is absorbed is formed at the interface between the SiCN:H film 4 and the SiCO:H film 6.

In the process of coating the chemically amplified resist to be processed into the resist pattern 9, the chemically amplified resist is coated on the entire surface of the substrate while the substrate is being rotated, and thereafter, the chemically amplified resist is baked at a temperature of about 150° C. At the time of this baking, in the vicinity of the interface between the SiCN:H film 4 and the SiCO:H film 6, H$_2$O desorbed from the layer which is formed at the interface and in which moisture is absorbed reacts with a NH$_2$ radical by the following reaction.

$$\equiv Si-NH_2 + H_2O \rightarrow \equiv Si-OH + NH_3$$

Here, ≡Si—NH$_2$ is a group included in the SiCN:H film 4 in the same way as the ≡Si—CH$_3$.

The ammonia (NH$_3$) generated by the reaction is diffused into the SiCO:H film 6 which is a Low-k film. The film density of the SiCO:H film 6 is about 30% lower than that of an SiO$_2$ film. Therefore, it can be thought that the generated ammonia is easily diffused into the SiCO:H film 6.

Here, because there is the dense SiO$_2$ film 7 on the top surface of the SiCO:H film 6, the generated ammonia cannot be diffused and desorbed from the top surface to the exterior. As a result, the generated ammonia is concentrated in the via hole h and at the periphery of the exterior thereof.

The ammonia concentrated in the via hole h and at the periphery of the exterior thereof becomes the cause that inhibits the resolution of the chemically amplified resist which will be the resist pattern 9 for forming a wiring trench. Because the acid generated at the exposed portion of the chemically amplified resist is neutralized by the ammonia, and the dissolution of the resist is inhibited.

Figure 2:
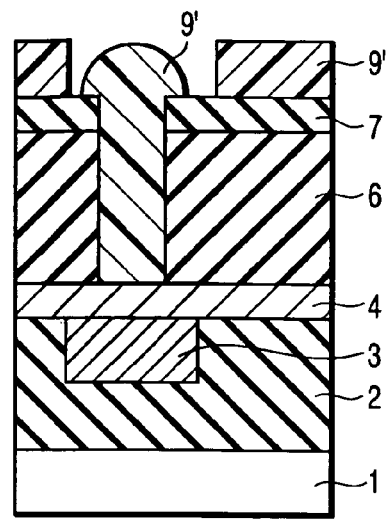
FIG. 2 is a cross-sectional view showing a cross-sectional shape of a resist pattern when a resolution inhibiting material is generated.
Figure 1I:
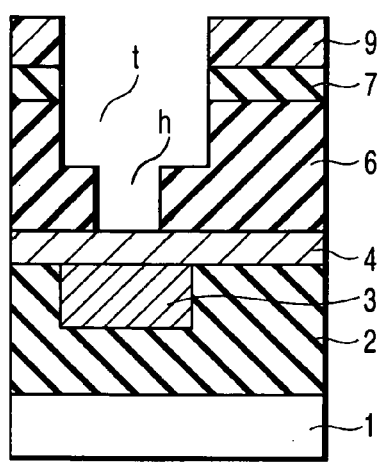

A cross-sectional shape of a resist pattern 9' when a resolution inhibiting material (NxHy) such as ammonia or the like is generated is shown in FIG. 2. In this case, because defect of the unresolution of the resist arises, as shown in FIG. 2, the resist pattern 9' is formed so as to cover the one part on the region which will be the wiring trench. Therefore, even if etching is carried out by using the resist pattern 9' as a mask, a wiring trench having a predetermined shape is not formed, thereby, a wiring having a predetermined shape is not formed.

In contrast, in the method of the present embodiment, because the SiC:H film 5 formed on the SiCN:H film 4 is the so-called sacrificed film, oxidation of the surface of the SiCN:H film 4 by O$_2$ plasma at the time of forming of the SiCO:H film 6 is prevented. In accordance therewith, it is ascertained that defect in the resolution of the chemically amplified resist to be processed into a resist pattern for forming a wiring trench as shown in FIG. 2 can be avoided, and the Cu wiring 11 having a predetermined shape can be obtained.

Here, when a plasma processing by He gas for forming the SiC:H film 5 was continuously carried out in the first reactive chamber V1 used for forming the SiCN:H film 4, the same effects could not be obtained, and, conversely, the extent of defects worsened.

It can be thought that the reason for this is that the SiCN:H film deposited on the interior of the first reactive chamber V1, in particular, on the counter electrode, is sputtered by He plasma, and an N ion generated due to the sputtered SiCN:H film being excited in plasma and the SiCN:H film 4 which is the underlying layer are reacted to one another as follows, $$\equiv Si-CH_3 + 2N^+ \rightarrow \equiv Si- + NH_3 + CN$$

and, ammonia is formed in the SiCN:H film 4.

Therefore, the plasma processing for forming the SiC:H film 5 could not be continuously carried out in the first reactive chamber V1 used for forming the SiCN:H film 4. However, provided that it is a film including nitrogen of an amount, which is such that the influence does not appear, i.e., deterioration in the resolution of the resist does not arise, the film may be formed in advance in the first reactive chamber V1.

As described above, in accordance with the present embodiment, in the dual damascene process in which a via hole is formed in advance, generation of a resolution inhibiting material (NxHy) which is the reason for deterioration in the resolution of the resist to be processed into the resist pattern 9 for forming a wiring trench can be effectively prevented, and the predetermined-shaped Cu damascene wirings 10 and 11 can be easily obtained.

Note that the present embodiment can be variously modified and executed. For example, in this embodiment, the SiC:H film 5 is used as a precoat film. However, the present invention is not limited thereto, for example, when a SiCO film or SiCO:H film is used as well, the same effects could be obtained.

Further, in the present embodiment, He gas which is one of the rare gases is used as a plasma source of the plasma processing for forming the precoat film. However, when Ar gas, Kr gas, and Xe gas (other rare gases) are used as well, the same effects could be obtained.

Moreover, hydrogen ($H_2$) gas, oxygen gas, or a mixed gas thereof can be added to the rare gas. When a mixed gas was added in a concentration of 10% or less, particularly good effects were obtained.

Furthermore, a gas of a material including silicon and carbon, for example, a gas of alkylsilane which is organic silane, or alkoxysilane can be mixed in the rare gas. When the gases of alkylsilane and alkoxysilane were mixed in a concentration of 90% or less, particularly good effects were obtained.

Further, in the present embodiment, because the plasma processing for forming the precoat film was carried out as a pretreatment for forming the SiCO:H film 6, the plasma processing was carried out at 350° C. which is the forming temperature of the SiCO:H film 6. However, the forming temperature is not limited to the temperature, and provided that it was 450° C. or less, the same effects could be obtained.

In addition, in the present embodiment, as a low dielectric constant interlayer insulating film, the example of the SiCO:H film 6 formed by a plasma CVD method is described. However, in a case of a porous application film formed by a application method, for example, an insulating film formed of a polymethyl siloxane, as well, due to a plasma processing of a gas including the rare gas described above being carried out as a pretreatment, deterioration in the resolution of the chemically amplified resist to be processed into the resist pattern 9 for forming a wiring trench is prevented in the same way as in the case of the SiCO:H film 6. Therefore, the Cu wiring 11 having a predetermined shape can be obtained.

Various process conditions of the present embodiment correspond to the logic devices of the so-called 90–100 nm generation. However, the method of the present embodiment is effective for, for example, the semiconductor devices of the generations after 70 nm generation, as well.

In this case, in order to sufficiently obtain the effects of the present embodiment, before the plasma processing by the gas including the rare gas for forming a precoat film is carried out, heating processing in which the substrate having the SiCN:H film 4 formed thereon is formed is heated at a temperature of 50° C. or less, is carried out.

Moreover, the modified examples can be appropriately combined.

(Second Embodiment)

Next, a method of manufacturing a semiconductor device, according to a second embodiment of the invention will be described. Note that processes which are the same as in the first embodiment will be described with reference to FIGS. 1A to 1J.

First, in the same way as in the first embodiment, as shown in FIGS. 1A and 1B, the SiCN:H film 4 is formed on the substrate including the silicon substrate 1 and the first Cu wiring layer.

Next, the substrate 1 is carried into the reactive chamber V1, and the substrate is disposed on the susceptor having the resistance heating heater provided in the reactive chamber V1. The pressure of the reactive chamber V1 is not specially reduced, and oxygen exists at the same ratio as in air, in a vapor phase in the reactive chamber V1.

Figure 3:
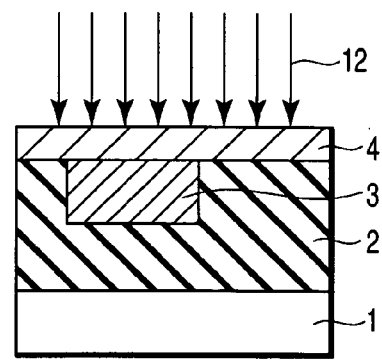
FIG. 3 is a cross-sectional view for explanation of a method of manufacturing a semiconductor device according to a second embodiment of the present invention.

After the substrate is heated by using the resistance heating heater such that the temperature of the substrate is made to be 200° C., as shown in FIG. 3, ultraviolet rays 12 are irradiated on the surface of the SiCN:H film 4. As a light source of the ultraviolet rays 12, for example, a lamp device for generating ultraviolet rays having a wavelength of 172 nm is used. Further, the irradiation time of the ultraviolet rays 12 is, for example, one minute.

After the irradiation of the ultraviolet rays 12 is completed, the substrate is carried out of the reactive chamber V1. Thereafter, in the same way as in the first embodiment, as shown in FIGS. 1D to 1J, the SiCO:H film 6, the $SiO_2$ film 7, the resist patterns 8 and 9, the barrier metal film 10, and the Cu wiring 11 are formed on the SiCN:H film 4.

In the method of the present embodiment as well, because deterioration in the resolution of the chemically amplified resist to be processed into the resist pattern 9 for forming a wiring trench is prevented, the effects which are the same as in the first embodiment can be obtained. Hereinafter, the reason that the deterioration in the resolution of the chemically amplified resist is prevented will be described.

In the case of the present embodiment, when the ultraviolet rays 12 are irradiated on the surface of the SiCN:H film 4, $O_2$ in a vapor phase of the reactive chamber V1 is excited, and the radical (O*) of oxygen is generated. The O* reacts with a ≡Si—$NH_2$ group (the generating source of NxHy) in the SiCN:H film 4 as follows, and as a result, it can be thought that the ≡Si—$NH_2$ group is eliminated from the interior of the SiCN:H film 4.

$$\equiv Si-NH_2+4O^* \rightarrow Si-O-Si\equiv +NO_2+H_2O$$

In the case of the present embodiment, oxidation of the SiCN:H film 4 by $O_2$ plasma at the time of the process of forming the SiCO:H film 6 is not prevented. However, the generating source of NxHy is eliminated as described above. Therefore, the problem that the acid generated at the exposed portion of the chemically amplified resist to be processed into the resist pattern 9 for forming a wiring trench is neutralized by NxHy and the dissolution thereof is inhibited does not arise, thereby the deterioration in the resolution of the chemically amplified resist does not arise.

Note that, in the present embodiment, as a pretreatment for forming of the SiCO:H film 6, the irradiating processing of the ultraviolet rays 12 was carried out. However, provided that the irradiating processing of electron rays is carried out, the same effects can be obtained. It can be thought that this is because O* is formed in a vapor phase in the same way as in the case of irradiation of ultraviolet rays, and moreover, Si—N bonding of the Si—$NH_2$ group which is the generating source of NxHy in the SiCN:H film 4 is cut by energy of the electron rays. In particular, when moisture in the SiCN:H film 4 is related to the reaction, the following reaction formula can be thought.

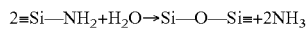

In accordance with such a reaction, oxidation by $O_2$ plasma at the time of the process of forming the SiCO:H film 6 is not suppressed. However, it is clear that, because the generating source of NxHy in the SiCN:H film 4 is reduced, the deterioration in the resolution of the resist pattern for forming a wiring trench as shown in FIG. 2, is avoided.

Further, in the present embodiment, the substrate was heated such that the temperature of the substrate is made to be 200° C., and the irradiation of ultraviolet rays was carried out, the temperature is not limited thereto, however, provided that the temperature is made to 450° C. or less, and the irradiation time is optimized, the same effects can be obtained at the temperature(450° C. or less). It suffices that the temperature of the substrate at the time of irradiating electron rays can be 450° C. or less in the same way. Further, energy rays other than ultraviolet rays and electron rays can be used.

(Third Embodiment)

Next, a method of manufacturing a semiconductor device, according to a third embodiment of the invention will be described. Note that processes which are the same as in the first embodiment will be described with reference to FIGS. 1A to 1J.

First, in the same way as in the first embodiment, as shown in FIGS. 1A and 1B, the SiCN:H film 4 is formed on the substrate including the silicon substrate 1 and the first Cu wiring layer.

Figure 4:
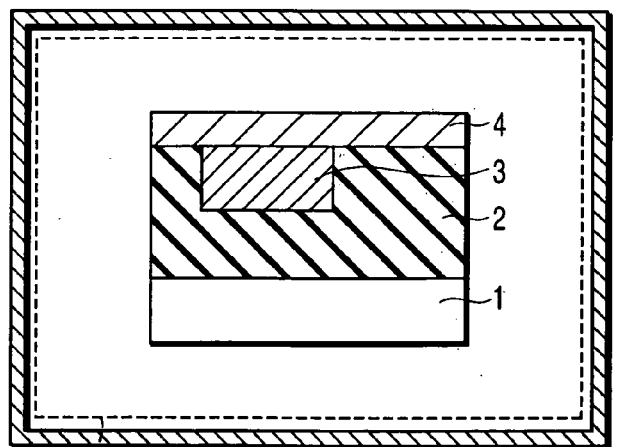
FIG. 4 is a cross-sectional view for explanation of a method of manufacturing a semiconductor device according to a third embodiment of the present invention.

Next, the substrate is carried into the reactive chamber V1, and $H_2O$ gas is introduced into the reactive chamber V1, and thereafter, as shown in FIG. 4, a humidified atmosphere 13 having the humidity of 80% and the temperature of 45° C. is formed in the reactive chamber V1, and the substrate is exposed in the humidified atmosphere 13 for fifteen minutes.

Subsequently, the substrate is carried out of the reactive chamber V1, and thereafter, the substrate is disposed on the susceptor having the resistance heating heater provided in the reactive chamber V2, and the substrate is heated by using the resistance heating heater such that the temperature of the substrate is made to be 350° C.

Thereafter, in the same way as in the first embodiment, as shown in FIGS. 1D to 1J, the SiCO:H film 6, the $SiO_2$ film 7, the resist patterns 8 and 9, the barrier metal film 10, and the Cu wiring 11 are formed on the SiCN:H film 4.

In the method of the present embodiment as well, the deterioration in the resolution of the chemically amplified resist to be processed into the resist pattern 9 for forming a wiring trench is prevented, and the effects which are the same as those of the first embodiment can be obtained. Hereinafter, the reason that the deterioration in the resolution of the chemically amplified resist is prevented will be described.

In the present embodiment, due to the humidifying processing in the humidified atmosphere 13 and the following heating processing, the following reaction arises in the SiCN:H film 4, and it can be thought that the $\equiv$Si—NH$_2$ which is the cause for generating NxHy is eliminated from the SiCN:H film 4.

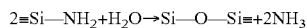

In the case of the present embodiment, oxidation of the SiCN:H film 4 by $O_2$ plasma at the time of the process of forming the SiCO:H film 6 is not prevented. However, the generating source of NxHy is eliminated as described above. Therefore, the problem that the acid generated at the exposed portion of the chemically amplified resist to be processed into the resist pattern 9 for forming a wiring trench is neutralized by the NxHy and the dissolution thereof is inhibited does not arise, thereby the deterioration in the resolution of the chemically amplified resist does not arise.

Note that, in the present embodiment, the humidifying processing was carried out with the temperature of the substrate set to 45° C., and thereafter, the heating processing was carried out with the temperature of the substrate set to 350° C. However, the temperatures of the substrate in the respective processings are not limited these values, and provided that it is 450° C. or less, the same effects can be obtained at any temperature in the respective processings. Further, the humidifying processing can be carried out due to moisture being introduced in the reactive chamber V1 under reduced pressure.

In the embodiments, the case of the two-layer Cu wiring layer was described. However, multi-layer Cu wiring layer having three or more layers can be formed by the same method. Further, the present invention can be applied, not to all the Cu wiring layers after the second layer, but to only layers thereof.

Further, in the embodiment, the case of the Cu wiring was described, the present invention can be applied to other metal wirings. Further, the semiconductor substrate is not limited to a silicon substrate, and for example, an SOI substrate, a semiconductor substrate including a distorted silicon, or an SiGe substrate.

Moreover, the stopper film is not limited to the SiCN:H film 4, and other films including silicon, carbon, nitrogen, and hydrogen can be used. In the same way, the low dielectric constant insulating film is not limited to the SiCO:H film (second insulating film), and other insulating films including silicon, carbon, oxygen, and hydrogen can be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device manufacturing method comprising:

forming a first insulating film including silicon, carbon, nitrogen, and hydrogen above a substrate in a first chamber;

carrying the substrate into a second chamber other than the first chamber, and discharging a rare gas in the second chamber; and forming a second insulating film including silicon, carbon, oxygen, and hydrogen above the first insulating film after the discharging the rare gas.

2. The semiconductor device manufacturing method according to claim 1, wherein the second chamber includes a film including silicon and carbon, a film including silicon, carbon, and hydrogen, a film including silicon, carbon, and oxygen, or a film including silicon, carbon, and hydrogen formed in advance.

3. The semiconductor device manufacturing method according to claim 2, wherein the film formed in the second chamber in advance fails to include nitrogen.

4. The semiconductor device manufacturing method according to claim 1, wherein a film thickness of the first insulating film is thinner than that of the second insulating film.

5. The semiconductor device manufacturing method according to claim 1, wherein the first and second insulating films are respectively formed in different chambers.

6. The semiconductor device manufacturing method according to claim 5, wherein the second insulating film is formed in the second chamber.

7. The semiconductor device manufacturing method according to claim 1, further comprising forming a third insulating film whose material is different from that of the second insulating film above the second insulating film.

8. The semiconductor device manufacturing method according to claim 2, wherein the carrying the substrate into the second chamber other than the first chamber, and discharging the rare gas in the second chamber comprises depositing a thin film on the first insulating film, the thin film being formed of material of the film formed in the second chamber in advance.

9. The semiconductor device manufacturing method according to claim 1, wherein the second insulating film is formed by a plasma CVD method or a applying method.

10. The semiconductor device manufacturing method according to claim 2, wherein the film is formed by a plasma CVD method in the second chamber in advance.

11. The semiconductor device manufacturing method according to claim 1, further comprising forming a connection hole and wiring trench in a laminated insulating film including the first and second insulating films, and burying a conductive film in the connection hole and the wiring trench.

12. A semiconductor device manufacturing method comprising:
    forming a first insulating film including silicon, carbon, nitrogen, and hydrogen above a substrate;
    irradiating an energy ray on the first insulating film; and
    forming a second insulating film including silicon, carbon, oxygen, and hydrogen by a plasma CVD method above the first insulating film after the irradiating the energy ray.

13. The semiconductor device manufacturing method according to claim 12, wherein the energy ray is an ultraviolet ray or an electron ray.

14. The semiconductor device manufacturing method according to claim 12, further comprising heating the substrate at the time of irradiating the energy ray on the first insulating film.

15. The semiconductor device manufacturing method according to claim 12, further comprising forming a third insulating film whose material is different from that of the second insulating film above the second insulating film.

16. The semiconductor device manufacturing method according to claim 12, further comprising forming a connection hole and wiring trench in a laminated insulating film including the first and second insulating films, and burying a conductive film in the connection hole and the wiring trench.

17. A semiconductor device manufacturing method comprising:
    forming a first insulating film including silicon, carbon, nitrogen, and hydrogen above a substrate;
    exposing the substrate in a humidified atmosphere including $H_2O$;
    heating the substrate after the exposing the substrate; and
    forming a second insulating film including silicon, carbon, oxygen, and hydrogen by a plasma CVD method above the first insulating film after the heating the substrate.

18. The semiconductor device manufacturing method according to claim 17, wherein the exposing the substrate in the humidified atmosphere is carried out under reduced pressure.

19. The semiconductor device manufacturing method according to claim 17, further comprising forming a third insulating film whose material is different from that of the second insulating film above the second insulating film.

20. The semiconductor device manufacturing method according to claim 17, further comprising forming a connection hole and wiring trench in a laminated insulating film including the first and second insulating films, and burying a conductive film in the connection hole and the wiring trench.

* * * * *

UNITED STATES PATENT AND TRADEMARK OFFICE
CERTIFICATE OF CORRECTION

PATENT NO. : 7,129,175 B2  Page 1 of 1
APPLICATION NO. : 10/726678
DATED : October 31, 2006
INVENTOR(S) : Miyajima et al.

It is certified that error appears in the above-identified patent and that said Letters Patent is hereby corrected as shown below:

Title page, item (73), in the Assignees, line 2, change "Sony, Corp.," to --Sony Corp.,--

Claim 9, column 11, line 24, change "a applying" to --an applying--.

Signed and Sealed this

Ninth Day of January, 2007

JON W. DUDAS
*Director of the United States Patent and Trademark Office*